US007821162B2

(12) United States Patent
Llorente Gonzalez et al.

(10) Patent No.: US 7,821,162 B2
(45) Date of Patent: Oct. 26, 2010

(54) LOW-VOLTAGE DIPS GENERATOR DEVICE

(75) Inventors: Jose Ignacio Llorente Gonzalez, Pamplona (ES); Miguel Linares Fano, Pamplona (ES)

(73) Assignee: Gamesa Innovation and Technology, S.L., Pamplona (Navarra) (ES)

( * ) Notice: Subject to any disclaimer, the term of this patent is extended or adjusted under 35 U.S.C. 154(b) by 196 days.

(21) Appl. No.: 11/886,709

(22) PCT Filed: Mar. 28, 2006

(86) PCT No.: PCT/ES2006/000149

§ 371 (c)(1),
(2), (4) Date: Nov. 10, 2008

(87) PCT Pub. No.: WO2006/106163

PCT Pub. Date: Oct. 12, 2006

(65) Prior Publication Data

US 2009/0066166 A1    Mar. 12, 2009

(30) Foreign Application Priority Data

Apr. 8, 2005    (ES) ................. 200500820

(51) Int. Cl.
  *G21C 21/28*    (2006.01)
(52) U.S. Cl. ...................... 307/156; 307/154
(58) Field of Classification Search ............... 307/154, 307/156

See application file for complete search history.

(56) References Cited

U.S. PATENT DOCUMENTS 4,445,047 A    4/1984    Cannon
5,424,588 A    6/1995    Cantor et al.
6,833,636 B1    12/2004    Nestel et al.

*Primary Examiner*—Robert L. Deberadinis
(74) *Attorney, Agent, or Firm*—Ladas & Parry LLP

(57) ABSTRACT

The invention relates to a device for generating low-voltage dips in an electrical power generator (2), particularly an aerogenerator, consisting of: a circuit which is disposed between the control cabinet (4) of the generator and the output transformer (3) to the network (30), comprising a transformer (31) and a plurality of in-series impedances (11, 14, 17; 12, 15, 18; 13, 16, 19) for each phase, having switches (24, 25, 26; 20, 21, 22; 27) associated therewith; and short-circuit generator means, selectively actuating the switches as a function of the type of voltage dip required.

6 Claims, 2 Drawing Sheets

LOW-VOLTAGE DIPS GENERATOR DEVICE

FIELD OF THE INVENTION

This invention refers to a device for generating voltage dips in an electrical power generator and particularly on a wind turbine connected to the internal network of a wind farm.

BACKGROUND OF THE INVENTION

Sudden voltage steps can be caused in the connection to the electrical output network of a park of electric generators such as wind turbines, as a result of network defects. In such cases, implementing the proper protection disconnects the defective part of the network, producing a new voltage step in the opposite direction and restoring the voltage to the regular level, prior to the defect. The combination of both steps is known as a "voltage dip" which can be defined by two parameters: the depth and the duration of the voltage step.

A "voltage dip" can cause a wind farm to be disconnected from the network bringing the consequent harmful effects along with it, this therefore requires the behaviour of wind turbines in response to voltage dips to be tested.

Previous techniques describe various different devices for generating voltage dips for different purposes.

Patent application WO0060430 describes a system for verifying the sensitivity of the components of a glass production plant in response to voltage dips that may occur, comprising a double cascade of industrial autotransformers connected to each phase of the current with at least two bipolar switches, which generates voltage dips in the machine output, in proportion to the values of the individual autotransformers located on the cascades. The system provides the option to vary the amplitude and the duration of the dip, along with the option to cause different voltage dips for each phase.

U.S. Pat. No. 5,886,429 proposes a computer controlled and monitored testing station for testing the response of electronic equipment connected to the same to voltage dips and swells generated by the station.

U.S. Pat. No. 5,920,132 describes a device which is able to generate a reduced voltage by means of an autotransformer on low power industrial equipment, only valid for low voltage.

None of the aforementioned devices can be applied for verifying the behaviour of electrical power generators such as wind turbines in response to different types of voltage dips. One must consider that in each country there are different standards on this matter, therefore, a wind turbine manufacturer must be able to verify the effects of different types of voltage dips on its machines in order to guarantee compliance with the different standards. This invention proposes a solution to this problem.

DESCRIPTION OF THE INVENTION

The subject of this invention is a device for testing, at low voltage, the behaviour of an electrical power generator such as a wind turbine in response to a voltage dip similar to one which may occur on the network to which is it connected, with the wind turbine connect to the network.

The device comprises:
  a circuit located between the output of the machine's generator, which for the purposes of this descriptive report shall be understood to be located in a control cabinet, and the transformer of the MV network output with a low voltage wye-delta transformer for the power relating to the generator, a plurality of in-series impedances for each phase, a first group of switches associated with each phase respectively, a second group of switches associated with the in-series impedances and a switch for connecting the circuit to ground;
  mechanisms for generating short circuits by activating the first group of switches to select a single phase, two phase or three phase voltage dip, by activating the second group of switches to select the depth of the voltage dip and, optionally, by activating the third switch to generate a short circuit to ground;
  mechanisms for protecting the network during voltage dip generation and particularly an inductor to achieve a minimum amount of disturbance on the network during voltage dip generation.

Other characteristics and advantages of this invention can be found in the following detailed description, explaining its purpose, in relation to the attached diagram.

DETAILED DESCRIPTION OF THE INVENTION

In a preferred embodiment, the invention device 1 is included in a platform or container located at the foot of the wind turbine 2, of a power rating ranging between 850 kW and 2 W, and is connected between the control cabinet 4 located at the output of the wind turbine and the LV/MV transformer 3.

Figure 1:
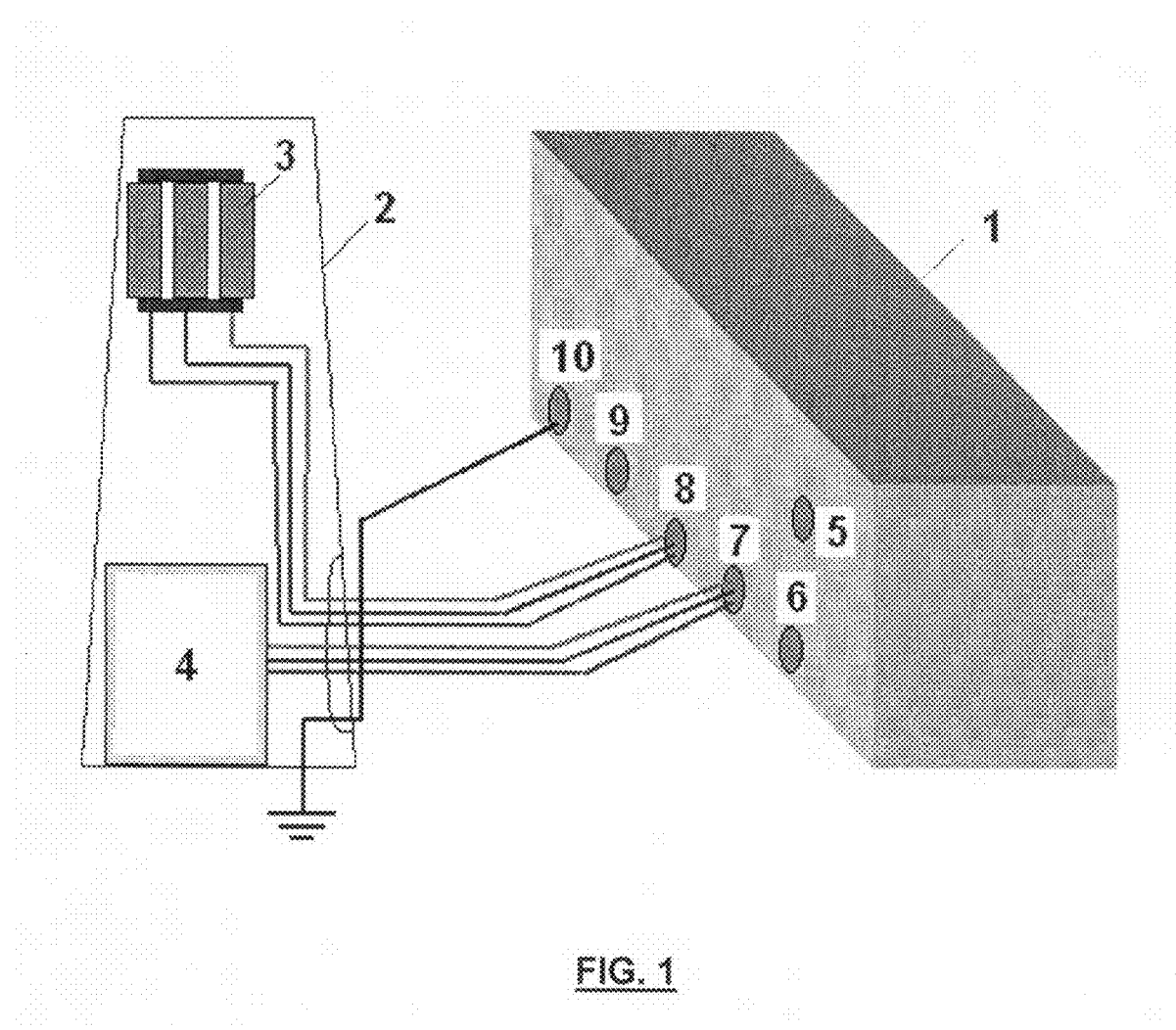
FIG. 1 shows the connection layout for the device for generating voltage dips, according to this invention.

As shown in FIG. 1, the device 1 is connected by means of port 7 to the control cabinet and by means of port 8 to the transformer 3. The device 1 includes other ports 5, 6, 9 and a further port 10 for the connection to ground.

Figure 2:
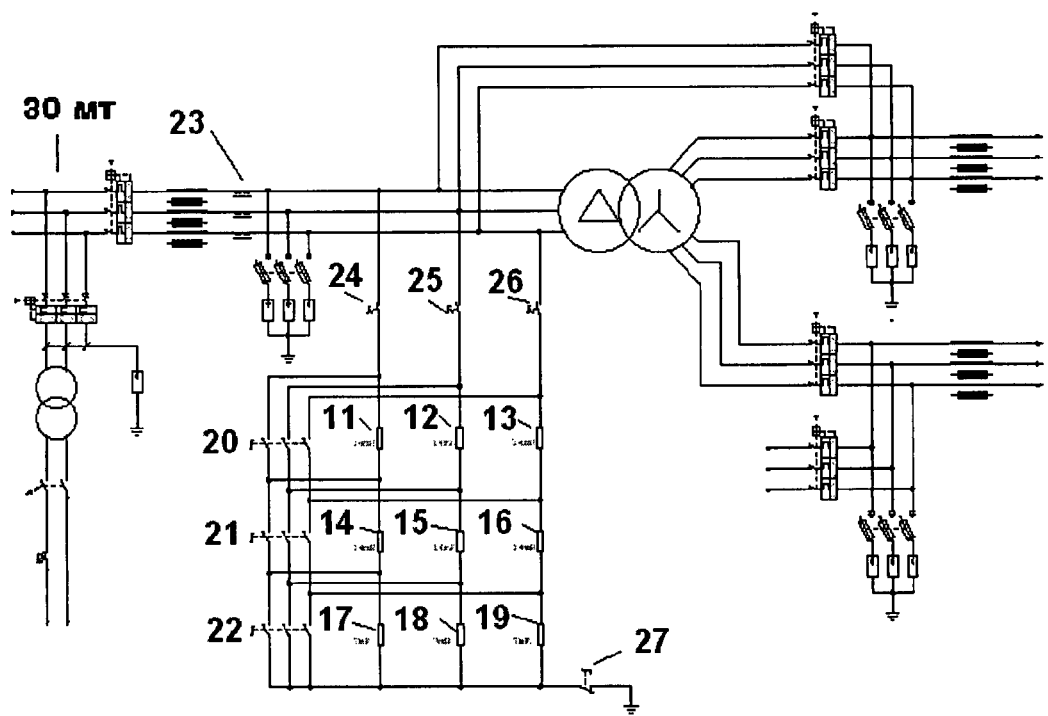
FIG. 2 shows a general layout of the device for generating voltage dips according to this invention.

The devices includes a circuit with a low voltage wye-delta transformer 31 for the power relating to the generator, three in-series impedances for each phase 11, 14, 17 (phase 1); 12, 15, 18 (phase 2); 13, 16 and 19 (phase 3); as shown in FIG. 2, associated on one side with a first group of switches 24, 25 and 26 for each phase, and on the other side, with a second group formed by three switches 20, 21 and 22 for each impeder, preferably 600 A, which, depending on their status, will produce short circuits of different characteristics, single phase or multi phase, and of different depths and durations in order to produce voltage dips of a maximum depth of 85%, and for a maximum duration of 500 milliseconds.

The invention device 1 also includes the necessary operation and control elements required for operating the aforementioned switches in order to generate different types of voltage dips.

The aforementioned device 1 is also equipped with temperature sensors to control its correct operation, with said temperature having to be within a range of 60° C. and 120° C.

The device 1 also includes an inductor 23, preferably of 60 µH, allowing a minimum level of disturbance to the network during the generation of voltage dips for the wind turbine 2, so that the rest of the wind turbines on the park can continue to operate normally.

The aforementioned voltage dip, single phase or multi phase, with or without ground, is generated by short circuits being produced between phases or between phases and ground. According to the invention device 1, switches 24, 25 and 26 are responsible for producing the short circuit for one, two or three phases, whilst switches 20, 21 and 22 are responsible for controlling the depth of the voltage dip produced, with switch 27 being that which connects the neutral to ground. The device 1 takes its power supply directly from the LV network.

The device 1 according to this invention is, therefore, capable of providing 8 different types of voltage dips, in regard to depth and duration time, based on the single phase or multi phase short circuits generated, described below, thus testing the response of the control cabinet 4 of the wind turbine 2:

- a three phase short circuit will generate a long voltage dip (prolonged duration time) or a small voltage dip (of little depth);
- a single phase short circuit will generate a long voltage dip (prolonged duration time) or a small voltage dip (of little depth);
- a two phase short circuit with ground will generate a long voltage dip (prolonged duration time) or a small voltage dip (of little depth);
- a two phase short circuit will generate a long voltage dip (prolonged duration time) or a small voltage dip (of little depth).

Other relevant elements of the device are as follows:

Voltage and current measurement points.

Bridging mechanisms which enable the direct connection of the wind turbine 2 to the network 30.

Mechanisms for switching between "normal" mode, where the device is disconnected at the transformer 3 and a "dips" mode where the device is connected allowing the field test times to be optimised.

In the preferred embodiment described above, modifications within the scope defined in the following claims can be made:

The invention claimed is:

1. Device (1) for generating voltage dips in an electrical power generator (2) with a control cabinet (4) at the output of the generator and an output transformer (3) to an electricity network (30) characterised in that it comprises:

a) a circuit located between the control cabinet (4) of the machine and the output transformer (3) to the network (30) with a transformer (31), a plurality of impedances (11, 14, 17; 12, 15, 18; 13, 16, 19) in-series for each phase, having a first group of switches (24, 25, 26) associated respectively with each phase and a second group of switches (20, 21, 22) associated with the in-series impedances, and a switch (27) for connecting the circuit to ground;

b) mechanisms for generating short circuits by activating the first group of switches (24, 25, 26) in order to select a single phase, two-phase or three-phase voltage dip, by activating the second group of switches (20, 21, 22) in order to select the depth of the voltage dip and by activating the third switch (27) in order to generate a short circuit to ground; and c) mechanisms for protecting the network (30) during voltage dip generation.

2. Device (1) for generating voltage dips in accordance with claim 1, characterised in that the mechanisms for protecting the network (30) comprise an inductor (23) to obtain a minimum level of disturbance to the network during voltage dip generation.

3. Device (1) for generating voltage dips in accordance with claim 1, characterised in that the electricity generation machine (2) is a wind turbine.

4. Device (1) for generating voltage dips in accordance with claim 3 characterised in that the power of the wind turbine (2) is between 850 kW and 2 MW.

5. Device (1) for generating voltage dips in accordance with claim 3 characterised in that it also includes bridging mechanisms enabling the wind turbine (2) to be directly connected to the network (30).

6. Device (1) for generating voltage dips in accordance with claim 3 characterised in that it also includes switching mechanisms for connecting/disconnecting it to/from the transformer (3).

* * * * *